United States Patent [19]

Vittoria

[11] 4,177,438

[45] Dec. 4, 1979

[54] SURFACE ACOUSTIC WAVE MODULATOR USING SINGLE CRYSTAL FILMS OF LITHIUM FERRITE

[75] Inventor: Carmine Vittoria, Bowie, Md.

[73] Assignee: The United States of America as represented by the Secretary of the Navy, Washington, D.C.

[21] Appl. No.: 925,726

[22] Filed: Jul. 18, 1978

[51] Int. Cl.$^2$ .................. H03H 9/26; H03H 9/30; H03C 3/38; H01L 41/12
[52] U.S. Cl. .................. 333/152; 332/26; 332/51 R; 332/154
[58] Field of Search .................. 333/193–196, 333/150–155, 147–148; 310/313, 26; 331/107 A; 330/5.5; 332/51 R, 51 W, 51 H, 26; 364/821–823; 365/157, 171, 172

[56] References Cited

U.S. PATENT DOCUMENTS

| | | | |
|---|---|---|---|
| 3,302,136 | 1/1967 | Auld | 333/147 |
| 4,078,186 | 3/1978 | Folen et al. | 333/153 X |

*Primary Examiner*—Paul L. Gensler
*Assistant Examiner*—Marvin Nussbaum

*Attorney, Agent, or Firm*—R. S. Sciascia; Philip Schneider; Melvin L. Crane

[57] ABSTRACT

A surface acoustic wave (SAW) device formed by an unitary insulating, magnetostrictive ferrite, slab whose easy axis of magnetization is initially (prior to the application of a d.c. magnetic biasing field) perpendicular to the direction of SAW-wave propagation. For example, the easy axis of magnetization in a single-crystal lithium ferrite slab is the <111> axis. Therfore this axis is aligned perpendicular to the SAW wave propagation direction and parallel to the edges of the SAW device. Application of a dc magnetic field swings the magnetic moments such that they will be parallel with the SAW wave propagation. Materials useful in carrying out this invention are those which have (1) an easy axis of magnetization, (2) good insulator qualities and (3) the magnetostrictive property. A dc magnetic field is applied parallel with the SAW direction or perpendicular to the easy axis of the material in order to align the magnetic moments in the direction of the SAW wave propagation. Such alignment of the magnetic moments of the material causes a delay in propagation time of the SAW wave.

8 Claims, 1 Drawing Figure

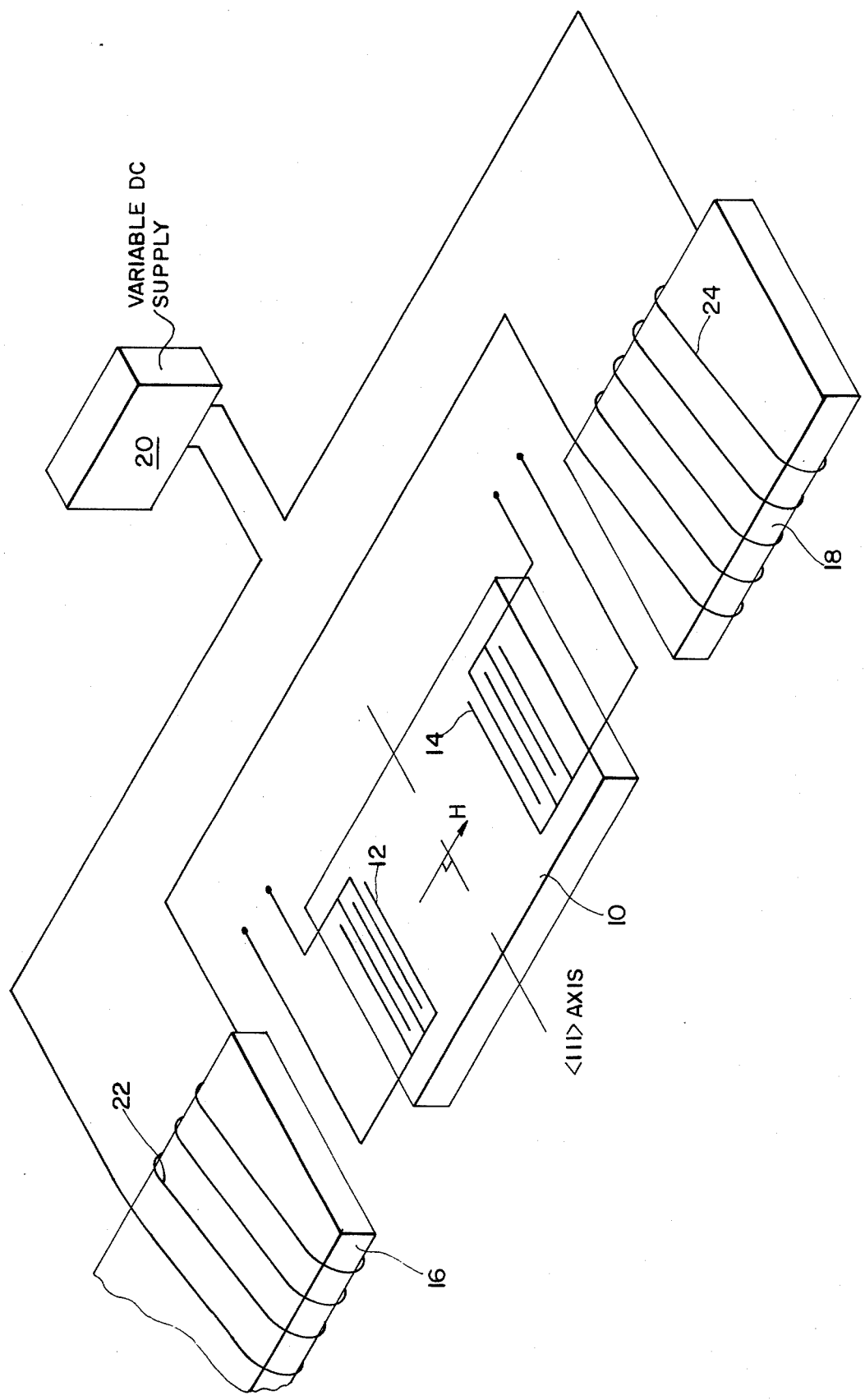

SURFACE ACOUSTIC WAVE MODULATOR USING SINGLE CRYSTAL FILMS OF LITHIUM FERRITE

BACKGROUND OF THE INVENTION

This invention relates to surface acoustic wave devices and more particularly to a single slab SAW device that is magnetically tuned.

It is well known in the prior art that SAW devices have a fixed delay between input and output terminals which is determined by material constraints and the separation between the terminals. Variable delays with SAW devices may be caused by mechanical and electronic devices. Mechanical devices have been used to apply a stress or strain on the material forming the SAW device while electronic means may be used to change an applied electric field. Each of these functions to change the index of refraction of the SAW device which causes a delay and/or phase change in the wave traversing the SAW device.

A SAW device most nearly resembling the device of this disclosure is described in U.S. Pat. No. 4,078,186. This patented device makes use of a magnetostrictive film on a substrate which functions to vary the characteristics of the substrate.

SUMMARY OF THE INVENTION

This SAW device uses a single slab of insulating magnetostrictive ferrite material upon which spaced input and output terminals are placed on the same surface of the slab. The input and output terminals are placed such that the direction of the SAW wave will be perpendicular to the easy axis or the <111> crystal axis. In conjunction therewith, a magnetic field is applied along the wave propagation direction in order to vary the delay time and/or phase shift of the wave.

BRIEF DESCRIPTION OF THE DRAWING

The drawing is a perspective view of the SAW device.

DETAILED DESCRIPTION

A SAW device comprises a single slab of a magnetostrictive and insulating material 10 such as lithium ferrite, for example. The lithium ferrite slab in its normal state is a single crystal with the <111> crystal axis or easy axis perpendicular to the path of the wave that is propagated along the surface of the slab. An input interdigital transducer 12 is affixed to one surface of the slab and is driven by an oscillator which generates a sine wave signal from 0.1 GHz to about 2.0 GHz. The limitation is imposed by the fabrication process of the interdigital "fingers". An output interdigital transducer 14 is affixed to the same surface of the slab as the input transducer and is so positioned to receive the SAW wave. The input and output transducers are placed such that the acoustical wave produced by the input transducer is perpendicular to the <111> crystal axis of the slab and propagates along the axis thereof. The pole pieces 16 and 18 of an electromagnet are placed in line with the plane of the slab and a variable direct current is applied from a variable dc supply 20 through the windings 22 and 24 on the pole pieces.

The slab of insulating-magnetostrictive material may be made of materials in the zinc, nickel ferrite family, the garnet family and the hexagonal magneto-plumbite ($BaFe_{12-2x}P_xQ_xO_{19}$) family where P and Q are impurities whose valances add up to a positive 6. Some impurities are titanium, cobalt, zinc, copper, and aluminum.

The slab may have a thickness of 20 $\mu$m or more, for example, and may be formed from the bulk single crystal or by epitaxial growth. The input and output terminals may be placed about 1 cm apart on the top surface of the slab. The input terminal directs the input beam along the surface of the slab with a wave direction perpendicular to the easy axis or <111> crystal axis. Lithium ferrite is a magnetostrictive and insulating material and therefore is well suited for the material of the slab. Since lithium ferrite is an insulator, propagation loss at high frequencies is less than that of metallic magnetostrictive film or piezoelectric substrates. Since the SAW device is made up totally of the magnetostrictive material, the interaction strength between the acoustic and magnetic motions is greater for this configuration than it is for a magnetostrictive matallic film modulating the acoustic motion in a piezoelectric SAW device. This means that greater continous changes in velocity of sound are possible with this configuration with small dc magnetic fields in comparison to the thin film modulator. Also greater pulse shifts are obtained with less applied dc magnetic field.

In operation, a signal is applied to the input transducer terminals to produce a SAW. A dc supply is applied to the electromagnet to produce a magnetic field H perpendicular to the <111> crystal axis or easy axis and along the propagation direction of the SAW. The SAW traverses the ferrite slab and is controlled by the magnetic field applied. On traversing the ferrite slab, the SAW is received by the output transducer which functions to produce an output signal. Application of the magnetic field strength changes the effective acoustic parameters via the magnetostriction coupling of the ferrite slab thereby causing a change in the velocity of the sound wave in the ferrite. Not only will there be a delay, but the phase of the wave will also be shifted. The delay and phase shift is dependent upon the dc magnetic field strength applied, the greater the dc magnetic field, the greater the delay and phase shift. Since the dc magnetic field is variable, there is a range over which a continuous change in sound velocity and, thus, a continuous change in delay and phase shift is obtainable.

To summarize the advantages of the present invention:

a. Since lithium ferrite is an insulator, propagation loss at high frequencies should be less than that in a similar device employing magnetostrictive metal films.

b. Since the ferrite slab can be as much as 20 $\mu$m or even thicker, greater phase shifts can be expected in comparison to the 1 $\mu$m thick magnetic film-piezoelectric substrate combinations which have been used theretofore.

c. Less dc magnetic field is required to change the delay time of the device in comparison to a magnetic film-piezoelectric substrate combination.

Obviously many modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. A continuously tunable SAW device comprising:

a slab of material comprising a unitary piece of magnetostrictive, insulating crystalline material having at least one flat surface;

input transducer means mounted on said flat surface of said slab of material for propagating an acoustic wave along said flat surface of said slab of material;

output transducer means mounted on the same flat surface of said slab of material as said input transducer and spaced therefrom for receiving said acoustic wave propagated by said input transducer; and means for applying a variable dc magnetic field in the direction of and along the propagation path of said acoustic wave for varying the propagation time of said acoustic wave between said input and output transducer means.

2. A SAW device as claimed in claim 1 wherein:
said input transducer is positioned on said flat surface such that an acoustic wave propagated thereby is perpendicular to the easy axis of magnetization of said slab of material.

3. A SAW device as claimed in claim 1 wherein:
said slab of material is lithium ferrite.

4. A SAW device as claimed in claim 3 wherein:
said slab of material is a single crystal with its <111> crystal axis perpendicular to the wave propagation.

5. A SAW device as claimed in claim 2 wherein:
the easy axis of magnetization of said crystalline material is its <111> crystal axis perpendicular to the wave propagation.

6. A SAW device as claimed in claim 5 wherein:
said slab of material has a thickness of about 20 $\mu$m and the transducers are separated by about 1 cm.

7. A SAW device as claimed in claim 2 wherein:
said slab crystalline material comprises a spinel and garnet ferrite.

8. A SAW device as claimed in claim 2 wherein:
said slab of crystalline material comprises a ferrite material of a hexagonal magento-plumbite (BaFe$_{12-2x}$P$_x$Q$_x$O$_{19}$) where P and Q are impurities whose valances add up to a positive 6.

* * * * *